(12) United States Patent
Amamiya

(10) Patent No.: US 7,126,412 B2
(45) Date of Patent: Oct. 24, 2006

(54) PREAMPLIFICATION CIRCUIT

(75) Inventor: Yasushi Amamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/484,088

(22) PCT Filed: Jul. 15, 2002

(86) PCT No.: PCT/JP02/07161

§ 371 (c)(1),
(2), (4) Date: Jan. 14, 2004

(87) PCT Pub. No.: WO03/009466

PCT Pub. Date: Jan. 30, 2003

(65) Prior Publication Data

US 2004/0174221 A1    Sep. 9, 2004

(30) Foreign Application Priority Data

Jul. 16, 2001    (JP)    ............................. 2001-214661

(51) Int. Cl.
*G05F 3/02*    (2006.01)

(52) U.S. Cl. .................. 327/538; 327/543; 330/308; 330/311; 330/288; 250/214 A

(58) Field of Classification Search ................ 327/379, 327/384, 310, 311, 314, 312, 309
See application file for complete search history.

(56) References Cited

U.S. PATENT DOCUMENTS

| | | | | |
|---|---|---|---|---|
| 3,560,755 A | * | 2/1971 | Blaise | 250/214 |
| 3,792,256 A | * | 2/1974 | Harting | 398/202 |
| 3,845,416 A | * | 10/1974 | Dolby | 333/14 |
| 3,927,383 A | * | 12/1975 | Fjarlie et al. | 330/59 |
| 3,980,970 A | * | 9/1976 | Grundy | 331/108 D |
| 4,118,621 A | | 10/1978 | Monticelli et al. | 250/214 |
| 4,174,503 A | * | 11/1979 | Merklinger et al. | 330/300 |
| RE30,781 E | * | 10/1981 | Miyamoto | 327/351 |
| 4,454,416 A | | 6/1984 | Gontowski, Jr. et al. | 250/214 |
| 4,467,191 A | * | 8/1984 | Chalfin et al. | 250/214 A |
| 4,736,125 A | | 4/1988 | Yuen | 330/59 |
| 5,371,479 A | * | 12/1994 | Hagerty | 330/294 |
| 5,565,672 A | | 10/1996 | Siegel et al. | 250/214 R |
| 5,786,730 A | | 7/1998 | Hadley | 330/59 |
| 5,798,668 A | * | 8/1998 | George | 327/538 |
| 5,926,058 A | * | 7/1999 | Umemura | 327/362 |

FOREIGN PATENT DOCUMENTS

| | | |
|---|---|---|
| JP | 4-225630 | 8/1992 |
| JP | 4-356805 | 10/1992 |
| JP | 5-243858 | 9/1993 |
| JP | 8-242127 | 9/1996 |
| JP | 9-260960 | 10/1997 |

(Continued)

*Primary Examiner*—Tuan T. Lam
*Assistant Examiner*—Hiep Nguyen
(74) *Attorney, Agent, or Firm*—Young & Thompson

(57) ABSTRACT

This preamplification circuit comprises a first circuit section, second circuit section the input signal of which is the output signal of the first circuit section, and third circuit section which is connected with the input section of the first circuit section and consumes a part of the current to be inputted to a connection point with the input section of the first circuit section and has the capacitance value of the third circuit section set at a value for suppressing a gain peaking of gain frequency characteristics which occurs in the preamplification circuit.

18 Claims, 14 Drawing Sheets

FOREIGN PATENT DOCUMENTS

| | | |
|---|---|---|
| JP | 10-126167 | 5/1998 |
| JP | 10-242774 | 9/1998 |
| JP | 11-8517 | 1/1999 |
| WO | WO99/48196 | 9/1999 |

* cited by examiner

PREAMPLIFICATION CIRCUIT

BACKGROUND OF THE INVETION

1. Field of the Invention

The invention relates to a pre-amplification circuit, and more particularly to a pre-amplification circuit preferably used as a front stage to an apparatus for receiving light.

2. Description of the Related Art

There is an urgent need for construction of a system for transmitting an optical signal at a super-high speed, in order to absorb rapid increase in communication volume accompanied with popularization of Internet and/or multi-media communication. A pre-amplification circuit constituting a receiver front end module which is one of components required to have a high operation rate in the above-mentioned system is necessary to have a preferred gain-frequency characteristic and a preferred output characteristic over a broad range. As such a pre-amplification circuit, there has been conventionally used a trans-impedance type pre-amplification circuit.

When a pre-amplification circuit is used as a receiver module, a photodetector is connected to an input terminal of the pre-amplification through a bonding wire, and an electric signal is input into the pre-amplification circuit in accordance with light entering the photodetector. Each of amplifier stages constituting the pre-amplification circuit is electrically connected to a power source through a bonding wire, a bypass capacitor and a lead wire, and direct-current bias current is applied to each of the amplifier stages.

The conventional receiver module is accompanied with two problems.

The first problem is a peak found in a gain-frequency characteristic.

In an optical receiver module receiving a data signal having a frequency of a GHz order, inductance (hereinafter, referred to as "L") and capacitance (hereinafter, referred to as "C") of wirings and bonding wires in circuits are not ignorable. Hence, an excess gain-peak is found in a certain frequency range in a trans-impedance gain-frequency characteristic. This gain peak deteriorates flatness of the characteristic.

The second problem is deformation in output waveform, caused when the output waveform is saturated in receiving much light.

Light entering a photodetector increases or decreases in accordance with a transmission distance in a light-transmitting system, and accordingly, an amplitude of a current signal to be input into a pre-amplification circuit increases or decreases. Hence, a pre-amplification circuit is required to cover a wide range of amplitude of an input current, in order to cover a wide range of transmission distance.

However, in general, as an amplitude of an input current increases beyond a base amplitude, a waveform of an output signal transmitted from a pre-amplification circuit is saturated and thus deformed. Finally, it becomes impossible for the waveform to respond to an input current without error.

This is because when an amplitude of an input current increases beyond a base amplitude, a current is introduced too much into an input section of a pre-amplification circuit, and hence, a voltage at an input section of an pre-amplification circuit is raised.

One of solutions to the first problem is to arrange a capacitor between an input section of a pre-amplification circuit and a grounded voltage.

A capacitance of a newly added capacitor would reduce influence exerted by inductance and/or capacitance of wirings and bonding wires in circuits in a module, and hence, could prevent a gain peak.

As a solution to the second problem, Japanese Patent Application Publication No. 4-225630 has suggested an optic receiver including an optic receiver and a Schottky barrier diode electrically connected in series to each other. A node through which the optic receiver is electrically connected to the Schottky barrier diode is electrically connected to an input terminal of a low-noise amplifier through a resistance and a capacitor electrically connected in series to each other.

In the suggested optic receiver, when a level of received light is low, and thus, a light-receiving element transmits a small current, the Schottky barrier diode is off, and accordingly, a current output from the light-receiving element is almost wholly introduced into the low-noise amplifier. On the other hand, when a level of received light is high, and thus, the light-receiving element transmits a much current, the Schottky barrier diode becomes on, and hence, only a limited current is introduced into the low-noise amplifier.

However, in the above-mentioned solution to the first problem, the capacitor arranged between an input section of an amplifier circuit and a grounded voltage does not reduce a current to be introduced into an input section of a pre-amplification circuit or a voltage to be applied to a pre-amplification circuit, and hence, cannot prevent deformation in a waveform of a signal output from a pre-amplification circuit which deformation is caused when a current having an amplitude exceeding a base amplitude is introduced into a pre-amplification circuit. After all, the deformation is identical with deformation observed when a capacitor is not arranged between an input section of an amplifier circuit and a grounded voltage.

That is, the solution to the first problem cannot solve the above-mentioned second problem.

The optic receiver suggested in Japanese Patent Application Publication No. 4-225630 does not suggest a solution to the first problem, and hence, the problem that an excess gain-peak found in a trans-impedance gain-frequency characteristic deteriorates flatness of the characteristic remains unsolved.

Japanese Patent Application Publication No. 5-243858 has suggested a trans-impedance type optical amplifier including a feedback having a resistance Rx for determining a gain, and an output transistor. An input current Iin and an output voltage Vout have a relation defined as follows.

$$V\text{out} = -I\text{in} \times R\text{x}$$

A diode is electrically connected in parallel to the feedback resistor in a forward direction, and means for varying a gain which means determines an input current at which the diode is turned on is electrically connected in series to the output transistor.

Japanese Patent Application Publication No. 10-242774 has suggested a light-receiving front-end amplifier including a feedback type trans-impedance circuit comprised of an amplifier including a transistor having a grounded emitter, and a feedback resistor, and further including a transistor having an emitter and a base both electrically connected in parallel to the feedback resistor, and a collector electrically connected to a reference voltage point.

Japanese Patent Application Publication No. 9-260960 has suggested an optic amplifier comprised of a photoelectric transfer device which is electrically connected to an input terminal and to which a bias voltage is applied, a trans-impedance type front-end amplifier to which an output current transmitted from the photoelectric transfer device is input, a circuit for controlling a gain of the trans-impedance type front-end amplifier, and a waveform-shaping circuit electrically connected to an output of the trans-impedance type front-end amplifier.

In view of the above-mentioned problems in the prior art, it is an object of the present invention to provide a pre-amplification circuit which is capable of solving the above-mentioned first and second problems, having a trans-impedance gain-frequency characteristic which is flat over a wide range of frequency, and suppressing deformation of a waveform of a signal transmitted therefrom even when an excess-current signal is introduced thereinto.

SUMMARY OF THE INVENTION

In order to achieve the above-mentioned object, the present invention provides a pre-amplification circuit including a first circuit, a second circuit receiving an output signal transmitted from the first circuit, as an input signal, a third circuit electrically connected to an input of the first circuit, and consuming a part of a current running into the input of the first circuit, wherein the third circuit has such a capacity that a gain peak observed in gain-frequency characteristic of the pre-amplification circuit is suppressed.

The third circuit may be comprised of a non-linear resistor electrically connected between the input of the first circuit and a grounded voltage.

The third circuit may be comprised of a device electrically connected between the input of the first circuit and a grounded voltage, and having a non-linear current-voltage characteristic.

For instance, the non-linear resistor or the device is comprised of a diode.

There is further provided a pre-amplification circuit including a first circuit, a second circuit receiving an output signal transmitted from the first circuit, as an input signal, a third circuit which is electrically connected to an input of the first circuit, which has a variable capacity, and which a part of a current running into the input of the first circuit enters, the third circuit including a circuit electrically connected between the input of the first circuit and a grounded voltage, and comprised of a diode and a power source electrically in series to each other.

There is still further provided a pre-amplification circuit including a first circuit, a second circuit receiving an output signal transmitted from the first circuit, as an input signal, a third circuit which is electrically connected to an input of the first circuit, which has a variable capacity, and which a part of a current running into the input of the first circuit enters, the third circuit including a diode electrically connected between the input of the first circuit and a grounded voltage, and having a capacity variable in accordance with a voltage.

There is yet further provided a pre-amplification circuit including a first circuit, a second circuit receiving an output signal transmitted from the first circuit, as an input signal, a third circuit which is electrically connected to an input of the first circuit, which has a variable capacity, and which a part of a current running into the input of the first circuit enters, the third circuit including a circuit electrically connected between the input of the first circuit and a grounded voltage, and comprised of a diode and a variable resistor electrically in series to each other.

It is preferable that a part of a current running into the first circuit enters the third circuit in accordance with a magnitude of the current.

It is preferable that the third circuit includes a capacitor electrically connected at one end to a terminal of the diode which terminal is opposite to a terminal through which the diode is electrically connected to the input of the first circuit, and electrically connected at the other end to a grounded voltage.

The pre-amplification circuit may further includes a feedback resistor electrically connected between the input of the first circuit and the second circuit.

It is preferable that the first circuit is comprised of a circuit for converting a current into a voltage and amplifying the thus converted voltage.

It is preferable that the second circuit is comprised of an emitter follower buffer circuit.

In another aspect of the present invention, there is provided an apparatus for receiving light, including such a pre-amplification circuit as mentioned above, and a photo-detector converting an optic signal into an electric signal, wherein an output of the photo-detector is electrically connected to an input of the first circuit of the pre-amplification circuit.

The present invention further provides an apparatus for receiving light, including the above-mentioned pre-amplification circuit, and a photo-detector converting an optic signal into an electric signal, wherein an output of the photo-detector is electrically connected to an input of the first circuit of the pre-amplification circuit.

The advantages obtained by the aforementioned present invention will be described hereinbelow.

As having been explained above, a device having a non-linear current-voltage characteristic, such as a diode, is electrically connected to an input section of a current-voltage converting and amplifying stage as a first circuit in the pre-amplification circuit in accordance with the present invention. Capacitance of the device controls a gain peak and provides a flat gain characteristic over a high frequency band. In addition, since a part of an excess current to be input into the current-voltage converting and amplifying stage is introduced into a grounded voltage through the device, it is possible to prevent the excess current from entering the pre-amplification circuit, suppressing deformation of a waveform of an output signal.

In addition, by designing a voltage at one terminal of the device to be controlled by a power source to which the one terminal is electrically connected, the device could have a variable capacitance, ensuring that it is possible to improve a characteristic between a trans-impedance gain and a frequency which characteristic has been degraded due to fluctuation in inductance of a bonding wire through which a photodetector and the first circuit are electrically connected to each other.

DESCRIPTION OF THE PREFERRED EMBODIMENTS

Preferred embodiments in accordance with the present invention will be explained hereinbelow with reference to drawings.

[First Embodiment]

Figure 1:
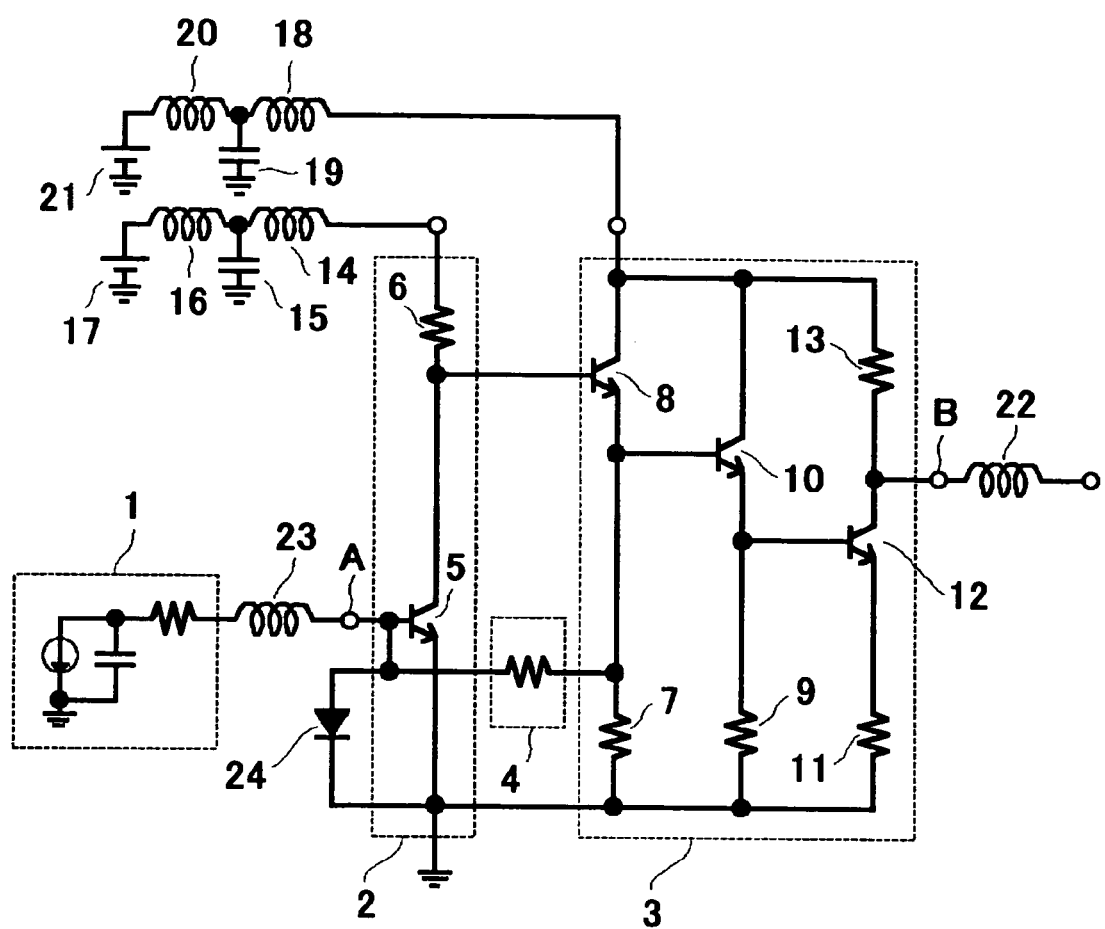
FIG. 1 is a circuit diagram of a pre-amplification circuit in accordance with the first embodiment of the present invention.
Figure 2:
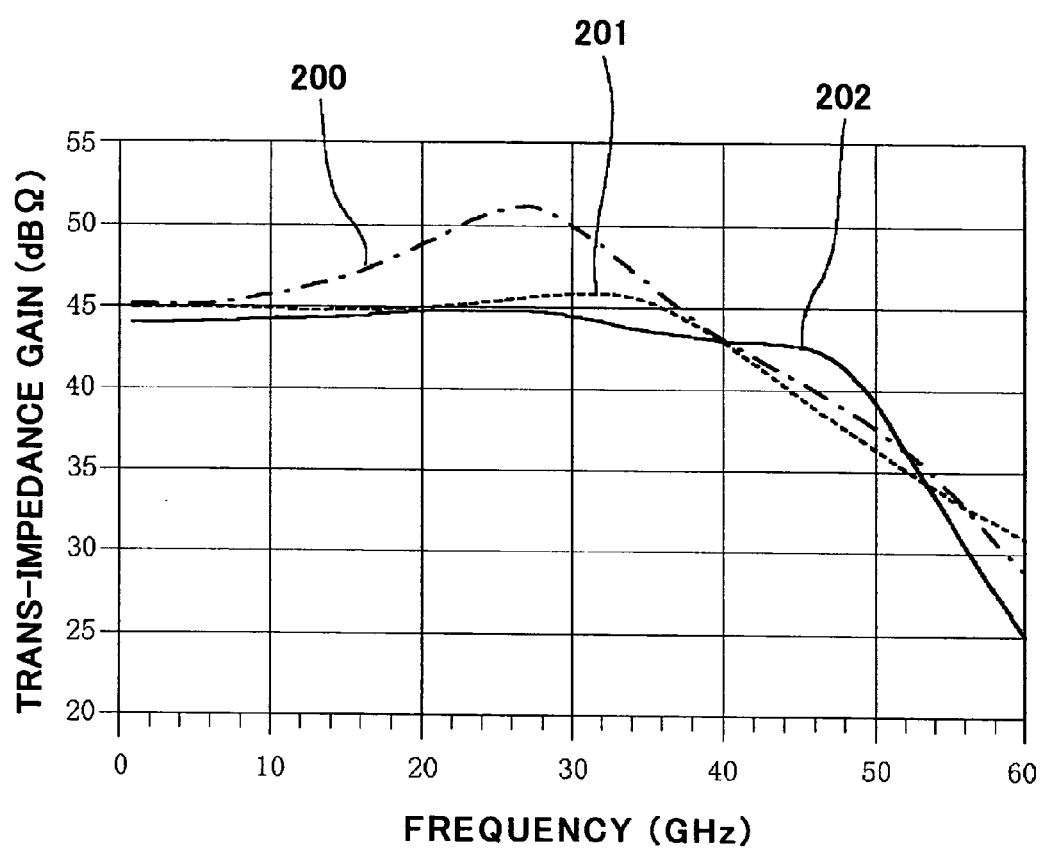
FIG. 2 is a graph showing a trans-impedance gain-frequency characteristic of the pre-amplification circuit illustrated in FIG. 1.
Figure 3:
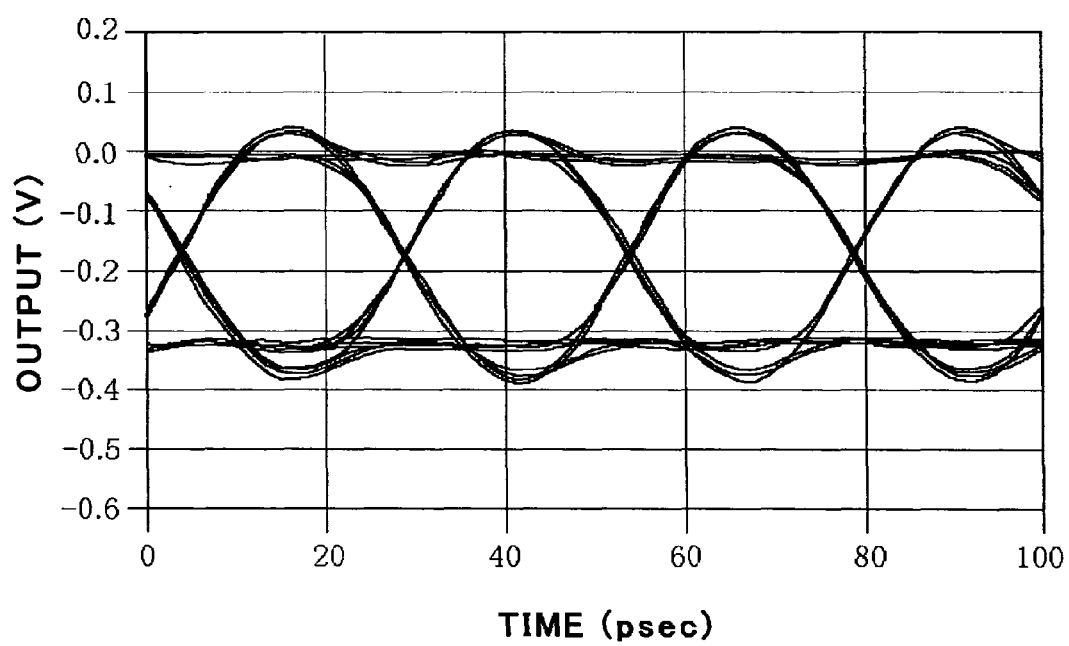
FIG. 3 shows waveforms of output signals transmitted from the pre-amplification circuit illustrated in FIG. 1 when a base input signal is input thereinto.
Figure 4:
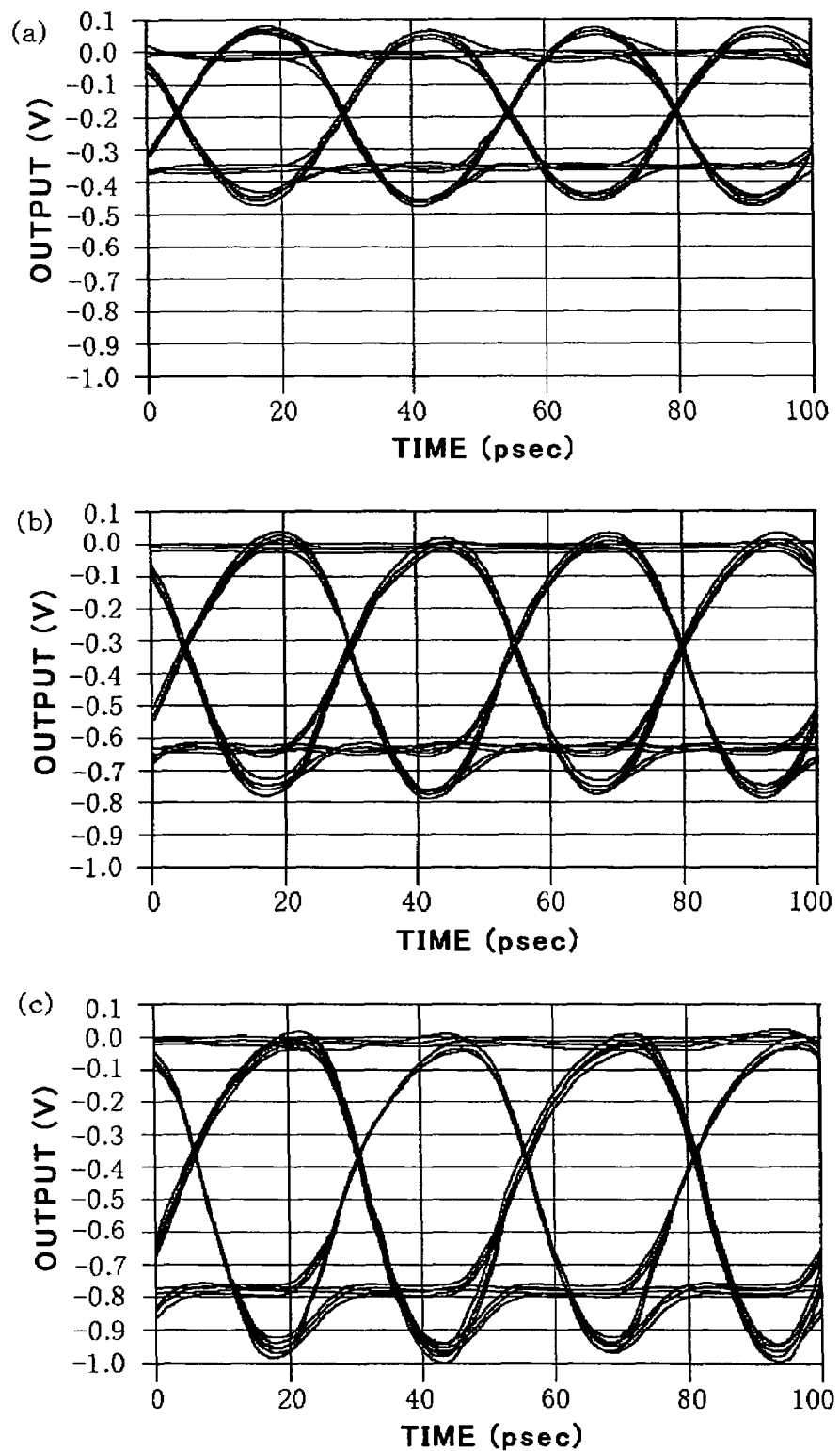
FIG. 4 shows waveforms of output signals transmitted from the pre-amplification circuit illustrated in FIG. 1 when an excess input signal is input thereinto.

FIG. 1 is a circuit diagram of a pre-amplification circuit in accordance with the first embodiment of the present invention. FIG. 2 is a graph showing a characteristic of the pre-amplification circuit illustrated in FIG. 1 between a trans-impedance gain and a frequency. FIG. 3 shows waveforms of output signals transmitted from the pre-amplification circuit illustrated in FIG. 1 when a base input signal is input thereinto. FIG. 4(*a*), (*b*) and (*c*) show waveforms of output signals transmitted from the pre-amplification circuit illustrated in FIG. 1 when an excess input signal is input thereinto.

The pre-amplification circuit in accordance with the first embodiment of the present invention is explained hereinbelow with reference to FIGS. 1 to 4.

As illustrated in FIG. 1, the pre-amplification circuit in accordance with the first embodiment is comprised of an integrated circuit including a stage 2 for converting a current into a voltage and amplifying the voltage, constituting a first circuit, an emitter follower buffer stage 3 constituting a second circuit, a feedback resistor 4, and a diode 24 constituting a third circuit.

The current-voltage converting and amplifying stage 2 is comprised of a first transistor 5 and a first resistor 6.

The first resistor 6 is electrically connected at one end to a power source 17 through a bonding wire 14 and a lead wire 16, and at the other end to both a collector of the first transistor 5 and a base of a later mentioned second transistor 8.

The first transistor 5 has a collector electrically connected to the first resistor 6 and a base of a second transistor 8, an emitter grounded, and a base electrically connected to an input terminal A of the pre-amplification circuit.

The emitter follower buffer stage 3 is comprised of the second transistor 8, a third transistor 10, a fourth transistor 12, a second resistor 7, a third resistor 9, a fourth resistor 11, and a fifth resistor 13.

The second transistor 8 has a collector electrically connected to a power source 21 through a bonding wire 18 and a lead wire 20, an emitter electrically connected to a base of the third transistor 10 and the second resistor 7, and a base electrically connected to a node at which the first resistor 6 and a collector of the first transistor 5 are electrically connected to each other. The second transistor 8 and the second resistor 7 constitute a first emitter follower buffer circuit.

The third transistor 10 has a collector electrically connected to the power source 21 through the bonding wire 18 and the lead wire 20, similarly to the collector of the second transistor 8, an emitter electrically connected to a base of the fourth transistor 12 and the third resistor 9, and a base electrically connected to a node at which the second resistor 7 and an emitter of the second transistor 8 are electrically connected to each other. The third transistor 10 and the third resistor 9 constitute a second emitter follower buffer circuit.

The fourth resistor 11 is grounded at one end, and is electrically connected at the other end to an emitter of the fourth transistor 12.

The fifth resistor 13 is electrically connected at one end to the power source 21 through the bonding wire 18 and the lead wire 20, and at the other end to a collector of the fourth transistor 12 and a bonding wire 22.

The fourth transistor 12 has a collector electrically connected to the fifth resistor 13, an emitter electrically connected to the fourth resistor 11, and a base electrically connected to a node at which the third resistor 9 and an emitter of the third transistor 10 are electrically connected to each other.

A signal input into the emitter follower buffer stage 3 is impedance-converted in the first and second emitter follower buffer circuits, and then, output to an output terminal B as an output signal through a collector of the fourth transistor 12.

The feedback resistor 4 is arranged between an emitter of the second transistor 8 of the emitter follower buffer stage 3 and a base of the first transistor 5 of the current-voltage converting and amplifying stage 2.

The current-voltage converting and amplifying stage 2 is electrically connected to the bias power source 17 through the bonding wire 14 and the lead wire 16. A bypass capacitor 15 is arranged between the bonding wire 14 and the lead wire 16 for reducing an impedance in an alternate current manner.

Similarly, the emitter follower buffer stage 3 is electrically connected to the bias power source 21 through the bonding wire 18 and the lead wire 20. A bypass capacitor 19 is arranged between the bonding wire 18 and the lead wire 20.

The bonding wire 22 is electrically connected to the output terminal B.

When the pre-amplification circuit in accordance with the first embodiment is used as a receiver module, a photodetector 1 is connected to the input terminal A of the pre-amplification circuit through a bonding wire 23. A current signal generated in accordance with a light entering the photodetector 1 is input into the pre-amplification circuit through the bonding wire 23 and the input terminal A.

A current signal having been input into the pre-amplification circuit is converted into a voltage, and the thus converted voltage is amplified in the current-voltage converting and amplifying stage 2. A signal output from a collector of the first transistor 5 of the current-voltage converting and amplifying stage 2 is input into the emitter follower buffer stage 3, and then, impedance-converted in the emitter follower buffer stage 3. Then, the signal is output from the pre-amplification circuit through the bonding wire 22.

The pre-amplification circuit in accordance with the first embodiment is designed to include the diode 24 as a third circuit. The diode 24 is electrically connected between an input section of the pre-amplification circuit, that is, a base terminal of the first transistor 5 of the current-voltage converting and amplifying stage 2, and a grounded voltage such that a direction towards a grounded voltage from the base terminal is a forward direction of the diode.

Hereinbelow is explained the first advantage obtained by the pre-amplification circuit in accordance with the first embodiment.

FIG. 2 is a graph showing a relation between a trans-impedance gain and a frequency.

In FIG. 2, a dashed line 200 shows a relation between a trans-impedance gain and a frequency which relation is observed when the pre-amplification circuit illustrated in FIG. 1 does not include the diode 24, and further when inductance and capacitance of wires and bonding wires are taken into consideration in the pre-amplification circuit. A broken line 201 shows a relation between a trans-impedance gain and a frequency which relation is observed when the pre-amplification circuit illustrated in FIG. 1 does not include the diode 24, and further when inductance and capacitance of wires and bonding wires are not taken into consideration in the pre-amplification circuit. A solid line 202 shows a relation between a trans-impedance gain and a frequency which relation is observed when inductance and capacitance of wires and bonding wires are taken into consideration in the pre-amplification circuit illustrated in FIG. 1.

As shown with the dashed line 200, when inductance and capacitance of wirings and bonding wires are taken into consideration, an excess gain-peak is observed in comparison with the broken line 201 in which inductance and capacitance of wirings and bonding wires are not taken into consideration.

In contrast, in the pre-amplification circuit in accordance with the first embodiment, as shown with the solid line 202, even if inductance and capacitance of wirings and bonding wires were taken into consideration, an excess gain-peak is not observed, ensuring flatness of a characteristic between a trans-impedance gain and a frequency.

In addition, since another gain peak is observed in a higher frequency range, a trans-impedance gain is increased in a high frequency range. As a result, a frequency range is enhanced as a whole.

Furthermore, the flatness of characteristic between a trans-impedance gain and a frequency and a wide range of a frequency band are reflected in the pre-amplification circuit in accordance with the first embodiment as a characteristic between an output signal and a base input signal, namely, waveforms having small jitters, as illustrated in FIG. 3.

Hereinbelow is explained the second advantage obtained by the pre-amplification circuit in accordance with the first embodiment.

FIG. 4 illustrates waveforms of output signals obtained when an excess input signal is input into the pre-amplification circuit with an amplitude of the input current signal being multiplied by 1.5 (FIG. 4(*a*)), 2 (FIG. 4(*b*)) and 2.5 (FIG. 4(*c*)) relative to an amplitude of a base input signal.

As illustrated in FIG. 4(*a*)–(*c*), even if a ratio of an amplitude of an input current signal to an amplitude of a base input signal is made higher, deformation in a waveform in an output signal slightly increases.

REFERENCE EXAMPLES

Figure 5:
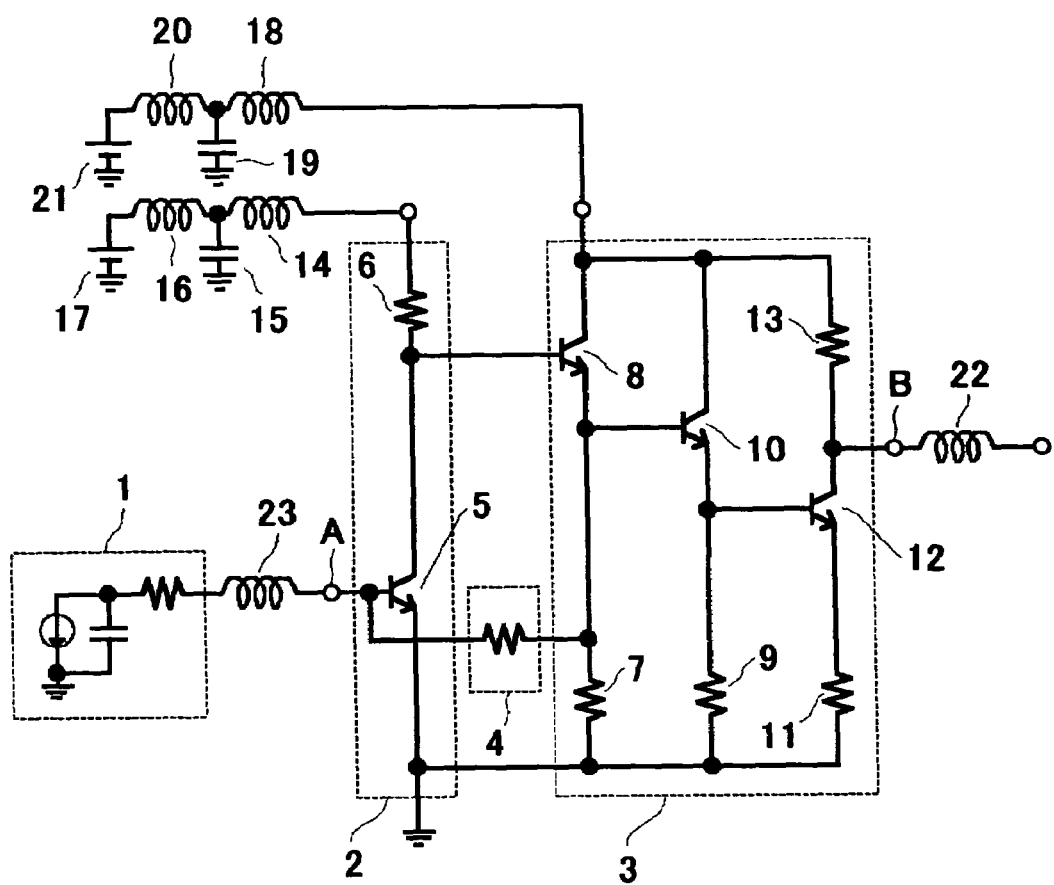
FIG. 5 is a circuit diagram of a pre-amplification circuit as a reference example.
Figure 6:
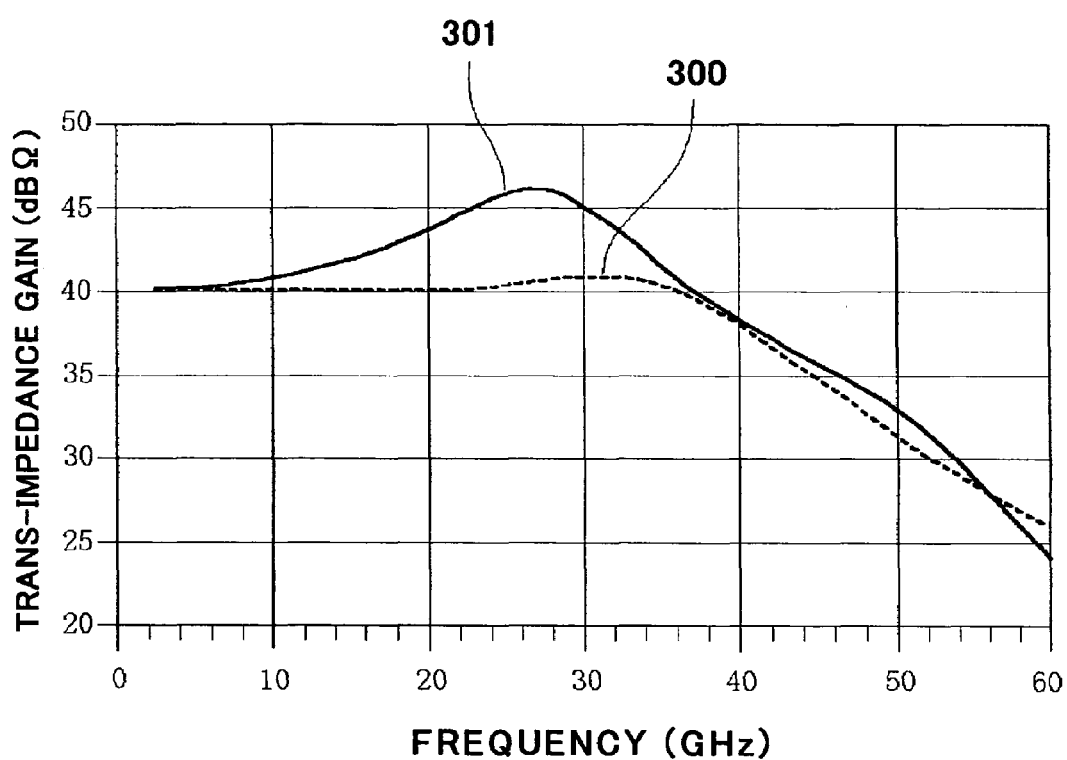
FIG. 6 is a graph showing a trans-impedance gain-frequency characteristic of the pre-amplification circuit illustrated in FIG. 5.
Figure 7:
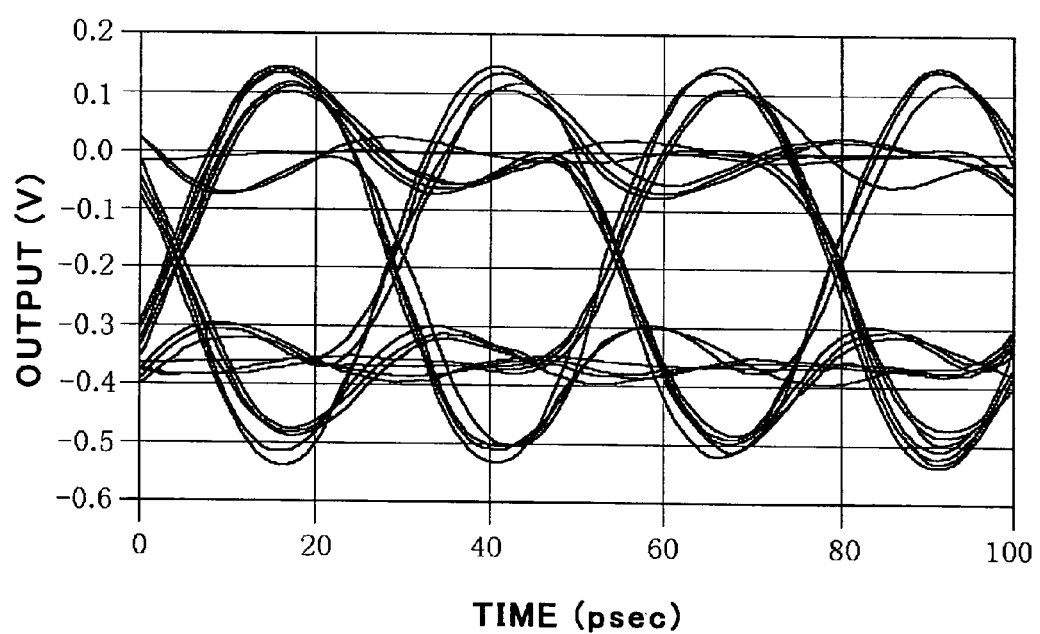
FIG. 7 shows waveforms of output signals transmitted from the pre-amplification circuit illustrated in FIG. 5 when a base input signal is input thereinto.
Figure 8:
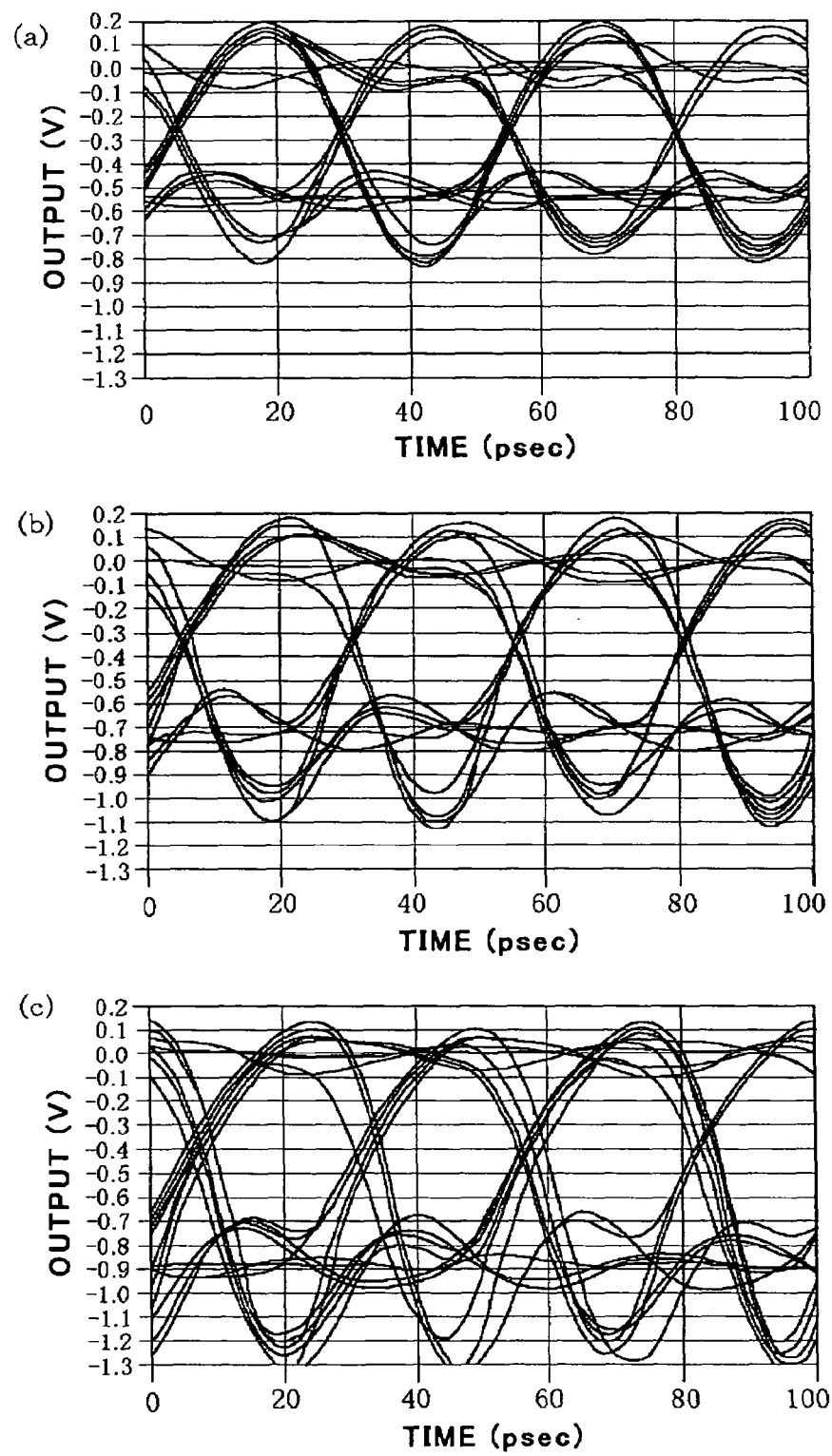
FIG. 8 shows waveforms of output signals transmitted from the pre-amplification circuit illustrated in FIG. 5 when an excess input signal is input thereinto.

FIG. 5 is a circuit diagram of a pre-amplification circuit as a reference example relative to the above-mentioned pre-amplification circuit in accordance with the first embodiment. FIG. 6 is a graph showing a trans-impedance gain-frequency characteristic of the pre-amplification circuit illustrated in FIG. 5. FIG. 7 shows waveforms of output signals transmitted from the pre-amplification circuit illustrated in FIG. 5 when a base input signal is input thereinto. FIG. 8 shows waveforms of output signals transmitted from the pre-amplification circuit illustrated in FIG. 5 when an excess input signal is input thereinto.

The pre-amplification circuit as a reference example, illustrated in FIG. 5, has the same structure as that of the pre-amplification circuit in accordance with the first embodiment, illustrated in FIG. 1, except that the pre-amplification circuit as a reference example is designed not to include the diode 24 as a third circuit.

In FIG. 6, a broken line 300 shows a characteristic of the pre-amplification circuit as a reference example, illustrated in FIG. 5, between a trans-impedance gain and a frequency on the assumption that the pre-amplification circuit has no inductance and capacitance of wirings and bonding wires, and a solid line 301 shows a characteristic of the pre-amplification circuit as a reference example between a trans-impedance gain and a frequency which characteristic is found when inductance and capacitance of wirings and bonding wires are taken into consideration.

As shown with the solid line 301 in FIG. 6, taking inductance and capacitance of wirings and bonding wires into consideration, there is found an excess gain peak which was not found in the pre-amplification in accordance with the first embodiment, resulting in that flatness of the characteristic between a trans-impedance gain and a frequency is deteriorated.

In addition, the frequency band is narrower than the frequency band in the pre-amplification circuit in accordance with the first embodiment, illustrated in FIG. 2.

As a result that the flatness of the characteristic between a trans-impedance gain and a frequency is deteriorated, as illustrated in FIG. 7, a characteristic between an output signal and a base input signal contains much jitters more than the jitters contained in the waveforms (see FIG. 3) of an output signal transmitted from the pre-amplification circuit in accordance with the first embodiment.

Furthermore, as illustrated in FIG. 8, deformation in a waveform of an output signal rapidly increases as a ratio of an amplitude of an input current signal to an amplitude of a base input signal is made increase up to 1.5 (FIG. 8(*a*)), 2 (FIG. 8(*b*)) and 2.5 (FIG. 8(*c*)).

Comparing the pre-amplification circuit in accordance with the first embodiment to the pre-amplification circuit as a reference example, it is found as the first advantage that a gain peak is remarkably improved in the characteristic between a trans-impedance gain and a frequency of the pre-amplification circuit in accordance with the first embodiment in comparison with the pre-amplification circuit as a reference example.

This is because addition of the diode 24 to an input section of the pre-amplification circuit results in that a certain capacity of the diode 24 is provided to the pre-amplification circuit, and hence, influence exerted by inductance and capacitance of wirings and boding wires in the pre-amplification circuit is reduced.

In addition, it is understood as the second advantage that jitters in an output characteristic of the pre-amplification circuit in accordance with the first embodiment are significantly reduced in comparison with the pre-amplification circuit as a reference example.

This is because a part of an excess input current introduced into an input section of the current-voltage converting and amplifying stage 2 is leaked through the diode 24 electrically connected to an input section of the pre-amplification circuit in a forward direction to a grounded voltage.

A magnitude of a current running through the diode 24 directed forwardly to a grounded voltage is dependent on a voltage at an input section of the pre-amplification circuit. As a magnitude of a current signal input from the photodetector 1 is high, a voltage at an input section of the pre-amplification circuit is high, and a leak current running through the diode 24 increases.

As a result, the pre-amplification circuit in accordance with the first embodiment makes it possible to reduce an excess input current signal, and hence, prevent deformation in a waveform of an output signal.

As mentioned above, the pre-amplification circuit in accordance with the first embodiment has a flat characteristic between a trans-impedance gain and a frequency over a broad high frequency band, and is able to suppress deformation of a waveform of an output signal which deformation is caused when the pre-amplification circuit receives an excess current signal.

[Second Embodiment]

Figure 9:
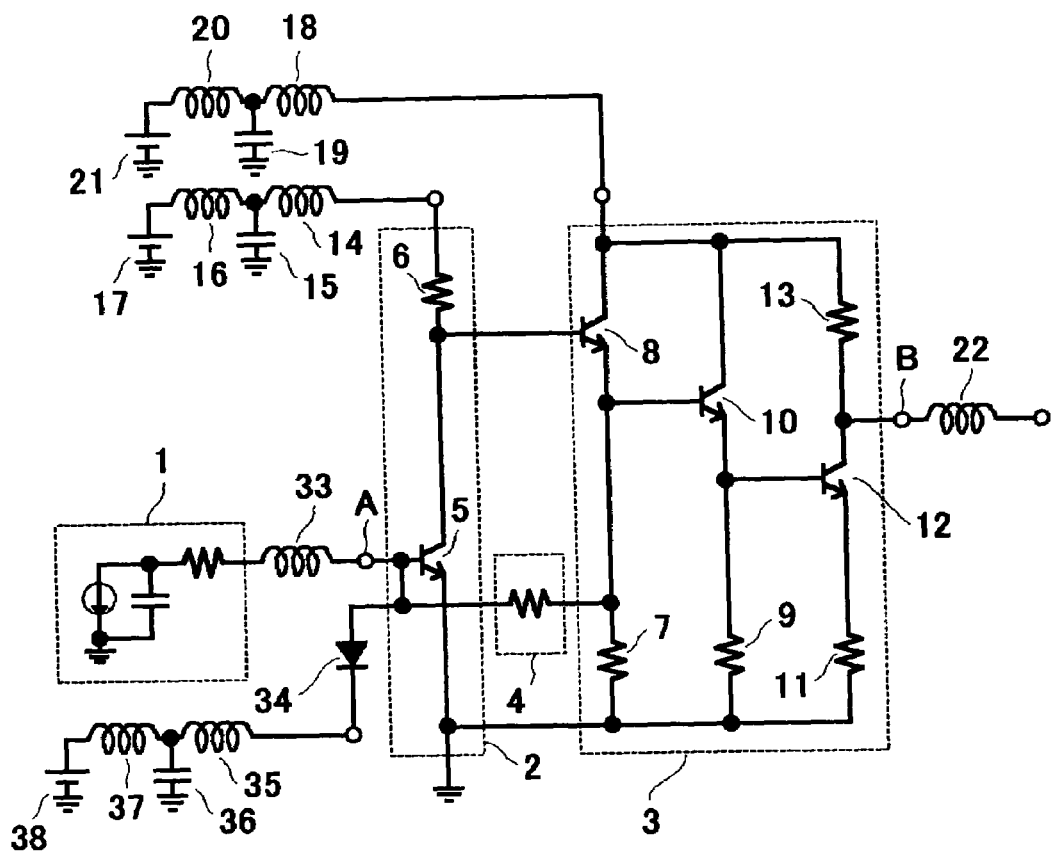
FIG. 9 is a circuit diagram of a pre-amplification circuit in accordance with the second embodiment of the present invention.
Figure 10:
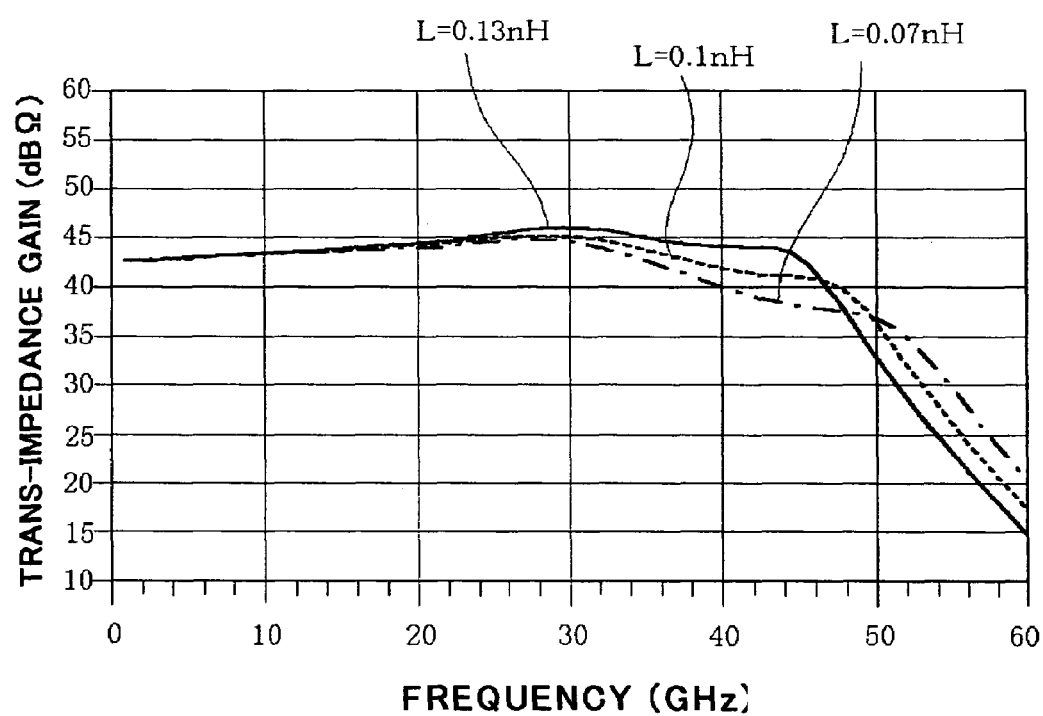
FIG. 10 is a graph showing a trans-impedance gain-frequency characteristic of the pre-amplification circuit with inductance of a bonding wire in the pre-amplification circuit illustrated in FIG. 1 being used as a parameter.
Figure 11:
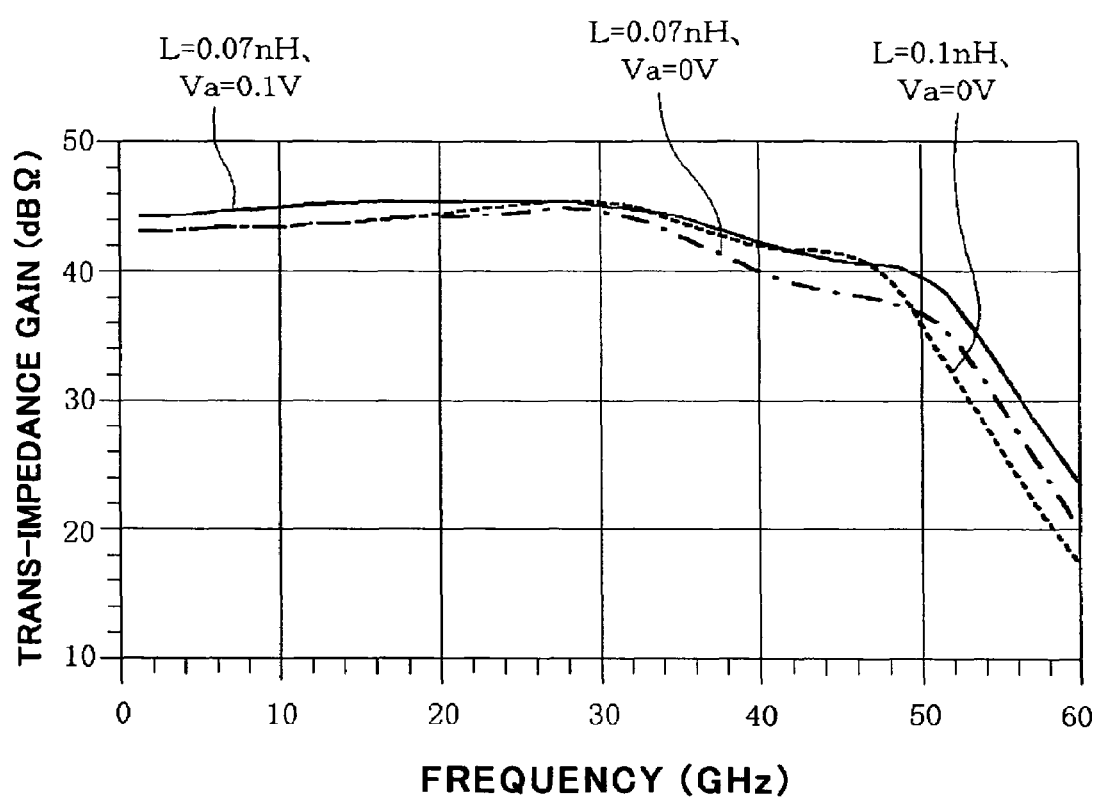
FIG. 11 is a graph showing a trans-impedance gain-frequency characteristic of the pre-amplification circuit illustrated in FIG. 9 with inductance of a bonding wire being used as a parameter.

FIG. 9 is a circuit diagram of a pre-amplification circuit in accordance with the second embodiment of the present invention. FIG. 10 is a graph showing a trans-impedance gain-frequency characteristic of the pre-amplification circuit with inductance of the bonding wire 23 in the pre-amplification circuit in accordance with the first embodiment, illustrated in FIG. 1, being used as a parameter. FIG. 11 is a graph showing a trans-impedance gain-frequency characteristic of the pre-amplification circuit with inductance of a bonding wire 33 in the pre-amplification circuit in accordance with the second embodiment, illustrated in FIG. 9, being used as a parameter.

The pre-amplification circuit in accordance with the second embodiment is designed to include a third circuit which is electrically connected to an input section of the current-voltage converting and amplifying stage 2 as a first circuit, which has a variable capacitance, and into which a part of a current introduced into an input section of the current-voltage converting and amplifying stage 2 is introduced in accordance with a magnitude of the current.

Whereas the third circuit in the pre-amplification circuit in accordance with the first embodiment is comprised of the diode 24 electrically connected between a base terminal of the first transistor 5 and a grounded voltage in a forward direction towards the grounded voltage, the third circuit in the pre-amplification circuit in accordance with the second embodiment is comprised of a diode 34 electrically connected between a base terminal of the first transistor 5 and a grounded voltage in a forward direction towards the grounded voltage from the base terminal of the first transistor 5 which diode 34 has a capacitance variable in accordance with a voltage applied thereacross.

Specifically, the third circuit in the second embodiment is comprised of a diode 34 electrically connected between a base terminal of the first transistor 5 in the current-voltage converting and amplifying stage 2 and a grounded voltage, a bonding wire 35, a lead wire 37 and a power source 38 electrically connected in series to one another in this order between the diode 34 and a grounded voltage, and a bypass capacitor 36 electrically connected between the bonding wire 35 and the lead wire 37.

The diode 34 is grounded at a cathode thereof through the bypass capacitor 36 in an alternate current manner. A capacitance of the diode 34 is controlled by controlling a voltage supplied from the power source 38, by means of the bonding wire 35, the lead wire 37 and the bypass capacitor 36.

Hereinbelow are explained advantages obtained by the pre-amplification circuit in accordance with the second embodiment.

The pre-amplification circuit in accordance with the second embodiment, designed to include the diode 34 electrically connected to an input section of the current-voltage converting and amplifying stage 2, has a flat characteristic between a trans-impedance gain and a frequency over a broad high frequency band, and is able to suppress deformation of a waveform of an output signal which deformation is caused when the pre-amplification circuit receives an excess current signal, for the reasons identical with those in the first embodiment.

In addition, since the diode 34 in the pre-amplification circuit in accordance with the second embodiment has a capacitance variable by controlling a voltage supplied from the power source 38, the pre-amplification circuit can provide the following advantage.

Since a gain peak is dependent much on inductance and capacitance in a circuit, if actual inductance and capacitance are different from designed inductance and capacitance, a capacitance of a diode necessary for suppressing a gain peak has to be varied accordingly.

In particular, reproducibility of a length of a bonding wire is dependent on packaging technology, inductance caused by a bonding wire can be uncertain factor. For instance, it is considered that inductance of a bonding wire varies by about ±30% due to an increase or decrease in a length of the bonding wire.

FIG. 10 is a graph showing a trans-impedance gain-frequency characteristic of the pre-amplification circuit with inductance of the bonding wire 23 in the pre-amplification circuit in accordance with the first embodiment, illustrated in FIG. 1, being used as a parameter.

As shown in FIG. 10, as inductance of the bonding wire 23 varies by ±30% around a base inductance of 0.1 nH in the range of 0.07 nH to 0.13 nH, the flatness and/or band of the characteristic between a trans-impedance gain and a frequency. Hence, it is preferable to control influence exerted by inductance and/or capacitance of a bonding wire and a lead wire after packaging in order to compensate for influence exerted by such uncertain factor.

The pre-amplification circuit in accordance with the second embodiment accomplishes such control by controlling a voltage supplied from the power source 38 to vary a capacitance of the diode 34.

With reference to FIG. 11, when the bonding wire 33 through which the photodetector 1 and the pre-amplification circuit in accordance with the second embodiment are electrically connected to each other has inductance of 0.07 nH, the flatness and/or band of the characteristic between a trans-impedance gain and a frequency are(is) improved, and resultingly, become(s) better than the flatness and band obtained when the bonding wire 33 has the designed inductance of 0.1 nH, by raising a voltage Va supplied from the power source 38 up to 0.1V from 0V.

Accordingly, even if inductance of the bonding wire varies, it is possible in the pre-amplification circuit in accordance with the second embodiment to improve a degraded characteristic between a trans-impedance gain and a frequency, by controlling the voltage Va supplied from the power source 38.

[Third Embodiment]

Figure 12:
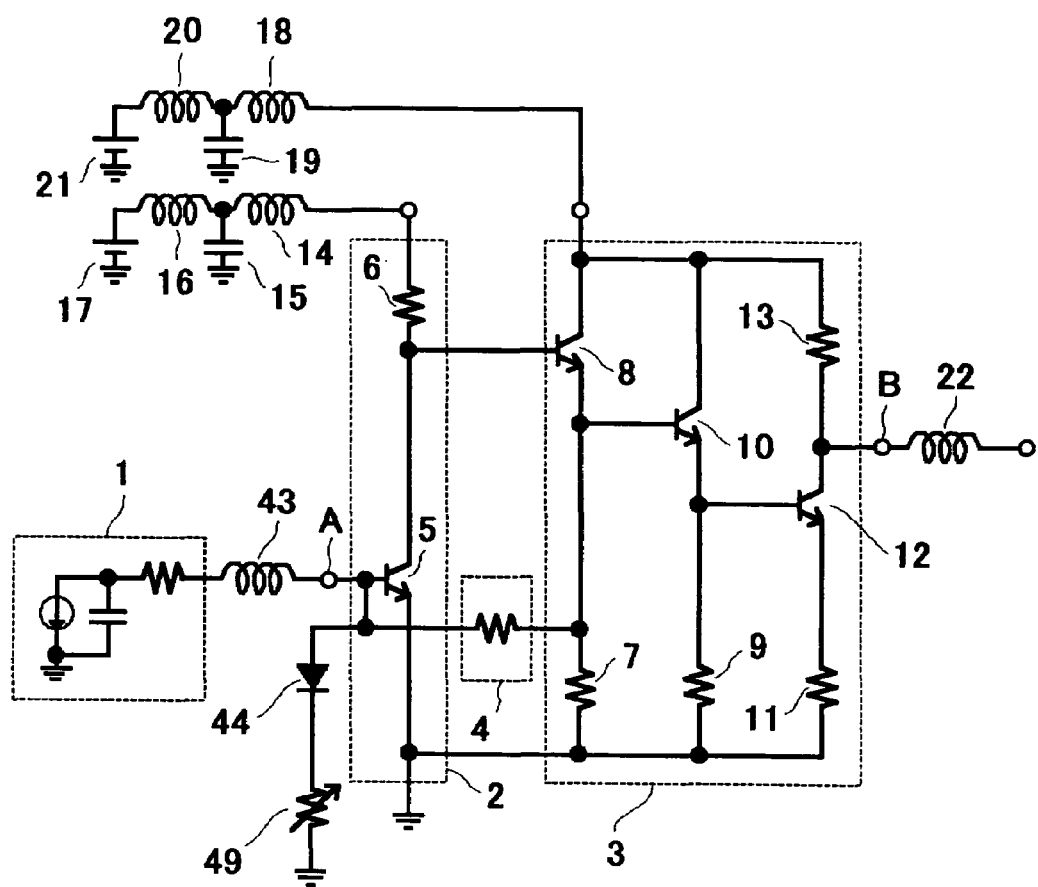
FIG. 12 is a circuit diagram of a pre-amplification circuit in accordance with the third embodiment of the present invention.
Figure 13:
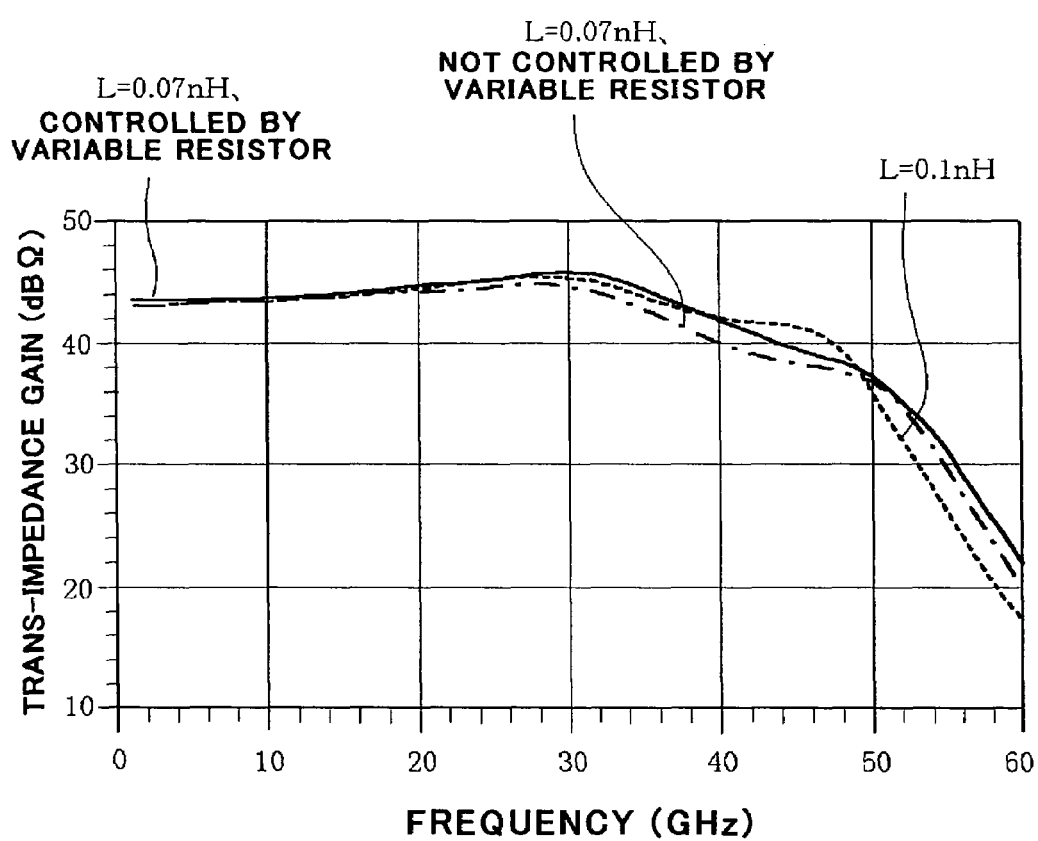
FIG. 13 is a graph showing a trans-impedance gain-frequency characteristic of the pre-amplification circuit illustrated in FIG. 12.

FIG. 12 is a circuit diagram of a pre-amplification circuit in accordance with the third embodiment of the present invention. FIG. 13 is a graph showing a trans-impedance gain-frequency characteristic of the pre-amplification circuit illustrated in FIG. 12.

Whereas the third circuit in the pre-amplification circuit in accordance with the first embodiment is comprised of the diode 24 electrically connected between a base terminal of the first transistor 5 and a grounded voltage in a forward direction towards the grounded voltage, the third circuit in the pre-amplification circuit in accordance with the third embodiment is comprised of a diode 44 electrically connected between a base terminal of the first transistor 5 of the current-voltage converting and amplifying stage 2 and a grounded voltage in a forward direction towards a grounded voltage, and a variable resistor 49 electrically connected between the diode 44 and a grounded voltage.

In the pre-amplification circuit in accordance with the third embodiment, the diode 34 and power source 38 electrically connected in series to each other in the pre-amplification circuit in accordance with the second embodiment, illustrated in FIG. 9, are replaced with the diode 44 and the variable resistor 49 electrically connected in series to each other.

In the pre-amplification circuit in accordance with the third embodiment, a capacitor of the diode 44 is controlled by controlling a voltage drop generated across opposite terminals of the variable resistor 49. A voltage drop generated across opposite terminals of the variable resistor 49 can be controlled by varying a resistance of the variable resistor 49.

Herein, similarly to the second embodiment, it is assumed that inductance of the bonding wire 43 through which the photodetector 1 and the pre-amplification circuit in accordance with the third embodiment are electrically connected to each other varies in the range of 0.1 nH and 0.07 nH.

As shown in FIG. 13, when the bonding wire 43 has inductance of 0.07 nH, the flatness and band of the characteristic between a trans-impedance gain and a frequency is improved by controlling a resistance of the variable resistor 49, similarly to the second embodiment, and thus, it would be possible to have the characteristic almost identical with the characteristic obtained when the bonding wire 43 has the designed inductance of 0.1 nH.

Accordingly, even if inductance of the bonding wire varies, it is possible in the pre-amplification circuit in accordance with the third embodiment to improve a degraded characteristic between a trans-impedance gain and a frequency, by controlling a resistance of the variable resistor 49.

[Fourth Embodiment]

Figure 14:
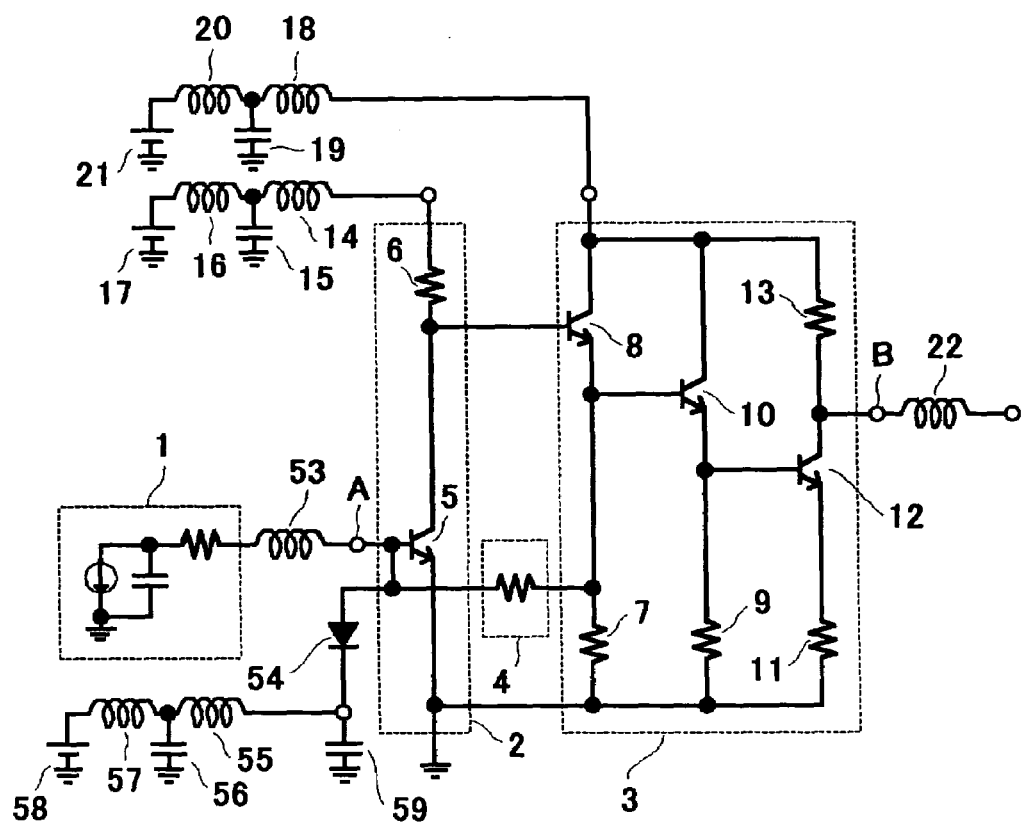
FIG. 14 is a circuit diagram of a pre-amplification circuit in accordance with the fourth embodiment of the present invention.

FIG. 14 is a circuit diagram of a pre-amplification circuit in accordance with the fourth embodiment of the present invention.

In comparison with the pre-amplification circuit in accordance with the second embodiment, illustrated in FIG. 9, the pre-amplification circuit in accordance with the fourth embodiment additionally includes a capacitor 59 as a part of a third circuit.

The capacitor is electrically connected between a terminal of the diode 54 closer to the power source and a grounded voltage. The capacitor is comprised of a MIM capacitor, for instance.

Hereinbelow are explained advantages obtained by the pre-amplification circuit in accordance with the fourth embodiment.

The pre-amplification circuit in accordance with the fourth embodiment has a flat characteristic between a trans-impedance gain and a frequency over a broad high frequency band, and is able to suppress deformation of a waveform of an output signal which deformation is caused when the pre-amplification circuit receives an excess current signal, for the reasons identical with those in the second embodiment.

In addition, a gain peak and the flatness and/or band of the characteristic between a trans-impedance gain and a frequency can be adjusted even after packaged, by controlling a capacitance of the diode 54.

Furthermore, by electrically connecting a terminal of the diode 54 closer to the power source to a grounded voltage through the capacitor 59, the terminal of the diode 54 is surely grounded in alternate current manner, and thus, it would be possible to prevent high-frequency signal from propagating towards the power source. Consequently, it would be possible to avoid that inductance and/or capacitance of the power source 58, the bonding wire 55 and the lead wire 57 harmfully influence the characteristic of the pre-amplification circuit.

In the pre-amplification circuit in accordance with the fourth embodiment, the power source 58 may be replaced with a variable resistor, similarly to the third embodiment, to have the variable resistor had functions of the power source 58.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the present invention.

For instance, any device may be used in place of the diodes 24, 34, 44 and 54 constituting the third circuit in the pre-amplification circuit, if the device shows non-linear current-voltage characteristic.

Bipolar transistors are used as active devices constituting the pre-amplification circuit, however, active devices are not to be limited to bipolar transistors. Other active devices such as a MOS transistor may be used.

The invention claim is:

1. A pre-amplification circuit including:
   a current to voltage conversion and amplification first circuit;

a second circuit receiving an output signal transmitted from said first circuit, as an input signal;

a voltage dependent variable capacitance third circuit which is electrically connected to an input of said first circuit, and which a part of a current running into said input of said first circuit enters, said third circuit including a circuit electrically connected between said input of said first circuit and a grounded voltage, and comprised of a diode and a power source electrically in series to each other, wherein, the first circuit comprises a first transistor (5) and a first resistor (6), the first resistor electrically connected at one end to a second power source (17) and at another end to both a collector of the first transistor and a base of a second transistor (8), and the second circuit is an emitter follower buffer stage, having a first emitter follower buffer circuit.

2. The pre-amplification circuit as set forth in claim 1, wherein a part of a current running into said first circuit enters said third circuit in accordance with a magnitude of said current.

3. The pre-amplification circuit as set forth in claim 1, wherein said third circuit includes a capacitor electrically connected at one end to a terminal of said diode which terminal is opposite to a terminal through which said diode is electrically connected to said input of said first circuit, and electrically connected at the other end to a grounded voltage.

4. The pre-amplification circuit as set forth in claim 1, further including a feedback resistor electrically connected between said input of said first circuit and said second circuit.

5. The pre-amplification circuit as set forth in claim 1, wherein the second circuit further comprises a second emitter follower buffer circuit so that a signal input into the second circuit is impedance-converted in the first and second emitter follower buffer circuits and output to an output terminal as an output signal.

6. The pre-amplification circuit as set forth in claim 1, wherein, the diode is electrically connected between said input of the first circuit and, through the first power source (38), to the grounded voltage, in a forward direction towards the grounded voltage from the input of the first circuit.

7. The pre-amplification circuit as set forth in claim 6, further comprising:

a bypass capacitor (36) connected in parallel with the first power source.

8. A pre-amplification circuit including:

a current to voltage conversion and amplification first circuit;

a second circuit receiving an output signal transmitted from said first circuit, as an input signal;

a voltage-depended variable capacitance third circuit which is electrically connected to an input of said first circuit, and which a part of a current running into said input of said first circuit enters, said third circuit including a diode electrically connected between said input of said first circuit and a grounded voltage, and having a capacitance variable in accordance with a voltage; and a feedback resistor (4) electrically connected between said input of said first circuit and said second circuit and, wherein, said capacitance variable in accordance with a voltage is a first power source, the first circuit comprises a first transistor (5) and a first resistor (6), the first resistor electrically connected at one end to a second power source (17) and at another end to both a collector of the first transistor and a base of a second transistor (8), a base of the first transistor providing an input terminal of the pre-amplification circuit, and the second circuit is an emitter follower buffer stage comprising the second transistor, a third transistor (10), a fourth transistor (12), a second resistor (7), a third resistor (9), a fourth resistor (11), and a fifth resistor (13), the second transistor has a collector electrically connected to a third power source (21), an emitter electrically connected to a base of the third transistor and the second resistor, and a base electrically connected to a node at which the first resistor and the collector of the first transistor are electrically connected to each other, the second transistor and the second resistor comprising a first emitter follower buffer circuit.

9. The pre-amplification circuit as set forth in claim 8, wherein a part of a current running into said first circuit enters said third circuit in accordance with a magnitude of said current.

10. The pre-amplification circuit as set forth in claim 8, wherein said third circuit includes a capacitor electrically connected at one end to a terminal of said diode which terminal is opposite to a terminal through which said diode is electrically connected to said input of said first circuit, and electrically connected at the other end to a grounded voltage.

11. The pre-amplification circuit as set forth in claim 8, wherein the third transistor and the third resistor comprise a second emitter follower buffer circuit so that a signal input into the second circuit is impedance-converted in the first and second emitter follower buffer circuits and output to an output terminal as an output signal.

12. The pre-amplification circuit as set forth in claim 8, wherein, the diode is electrically connected between the base terminal of the first transistor and the grounded voltage in a forward direction towards the grounded voltage from the base terminal of the first transistor, the diode has a capacitance variable in accordance with a voltage applied across the diode.

13. The pre-amplification circuit as set forth in claim 12, further comprising:

a bypass capacitor (36) connected parallel the first power source, the diode grounded at a cathode thereof through the bypass capacitor in an alternate current manner, a capacitance of the diode controlled by a voltage supplied from the first power source.

14. A pre-amplification circuit including:

a current to voltage conversion and amplification first circuit;

a second circuit receiving an output signal transmitted from said first circuit, as an input signal;

a voltage dependent variable capacitance third circuit which is electrically connected to an input of said first circuit, and which a part of a current running into said input of said first circuit enters, said third circuit including a circuit electrically connected between said input of said first circuit and a grounded voltage, and comprised of a diode and a first power source electrically in series to each other, wherein, the first circuit comprises a first transistor (5) and a first resistor (6), the first resistor electrically connected at one end to a second power source (17) and at another end to both a collector of the first transistor and a base of a second transistor (8)

a base of the first transistor providing an input terminal of the preamplification circuit, and the second circuit is an emitter follower buffer stage comprising the second transistor, a third transistor (10), a fourth transistor (12), a second resistor (7), a third resistor (9), a fourth resistor (11), and a. fifth resistor (13), the second transistor has a collector electrically connected to a third power source (21), an emitter electrically connected to a base of the third transistor and the second resistor, and a base electrically connected to a node at which the first resistor and the collector of the first transistor are electrically connected to each other, the second transistor and the second resistor comprising a first emitter follower buffer circuit.

15. The pre-amplification circuit as set forth in claim 14, wherein the third transistor and the third resistor comprise a second emitter follower buffer circuit so that a signal input into the second circuit is impedance-converted in the first and second emitter follower buffer circuits and output to an output terminal as an output signal.

16. The pre-amplification circuit as set forth in claim 14, wherein, the diode is electrically connected between the base terminal of the first transistor and the grounded voltage in a forward direction towards the grounded voltage from the base terminal of the first transistor.

17. The pre-amplification circuit as set forth in claim 14, wherein, the diode is electrically connected to the base terminal of the first transistor and, through the first power source (38), to the grounded voltage, in a forward direction towards the grounded voltage, from the base terminal of the first transistor.

18. The pre-amplification circuit as set forth in claim 17, further comprising:

a bypass capacitor (36) connected parallel the first power source.

* * * * *